United States Patent [19]
Mukerji et al.

[11] Patent Number: 5,614,131
[45] Date of Patent: Mar. 25, 1997

[54] METHOD OF MAKING AN OPTOELECTRONIC DEVICE

[75] Inventors: Prosanto K. Mukerji, Phoenix; Alexander J. Elliott, Tempe; Shanmugam Suppiah, Scottsdale, all of Ariz.

[73] Assignee: Motorola, Inc., Schaumburg, Ill.

[21] Appl. No.: 431,994

[22] Filed: May 1, 1995

[51] Int. Cl.$^6$ .................................................. B29D 11/00
[52] U.S. Cl. .......................... 264/1.9; 264/553; 264/571; 264/272.15; 264/272.17
[58] Field of Search .............................. 264/1.1, 1.7, 1.9, 264/1.24, 1.25, 553, 272.11, 272.14, 272.15, 272.17, 334, 101, 102, DIG. 78, 571

[56] References Cited

U.S. PATENT DOCUMENTS

| | | |
|---|---|---|
| 4,034,466 | 7/1977 | Thome . |
| 4,230,792 | 5/1980 | Thompson . |
| 4,292,735 | 10/1981 | Thillays ................................... 264/1.9 |
| 4,439,006 | 3/1984 | Stevenson ........................... 264/272.17 |
| 4,645,551 | 2/1987 | Adams et al. . |
| 4,686,764 | 8/1987 | Adams et al. . |
| 4,712,017 | 12/1987 | Kamasaki . |
| 4,822,536 | 4/1989 | Voinis et al. ........................ 264/272.17 |
| 4,944,908 | 7/1990 | Leveque et al. ..................... 264/272.15 |
| 5,167,556 | 1/1992 | Stein .................................... 264/272.17 |
| 5,329,131 | 7/1994 | Wijdenes et al. . |
| 5,391,346 | 2/1995 | Nakamura et al. ................. 264/272.15 |

FOREIGN PATENT DOCUMENTS

| | | | |
|---|---|---|---|
| 1-293597 | 11/1989 | Japan ................................ 264/272.11 |
| 5-315387 | 11/1993 | Japan ................................ 264/272.17 |

*Primary Examiner*—Mathieu D. Vargot
*Attorney, Agent, or Firm*—Robert F. Hightower

[57] ABSTRACT

An optoelectronic device is fabricated by casting a transparent polymeric body surrounding an electronic component. A reflective layer is formed over the polymeric body. The reflective layer acts as a mirror to reflect light emitted by one electronic component to another electronic component which receives the light. By casting the polymeric body, a consistent and defined shape for optical transmission is provided for forming the shape of the reflective layer.

14 Claims, 3 Drawing Sheets

5,614,131

METHOD OF MAKING AN OPTOELECTRONIC DEVICE

BACKGROUND OF THE INVENTION

This invention relates, in general, to a method of forming an optoelectronic device, and more particularly, to a method of forming an optoelectronic device encapsulated in a cast polymer.

An optoelectronic device or coupler comprises an optical emitter and an optical receiver encapsulated in a discrete package. The optical emitter is comprised of a light emitting diode which is electrically coupled to an substrate or lead. The optical emitter is electrically isolated from the optical receiver. The optical receiver is comprised of a light sensing diode which is electrically coupled to an substrate or leadframe. The optical emitter and optical receiver are encapsulated in a transparent epoxy. An opaque, light reflective mold compound further encloses the optical transmitter and optical receiver and transparent epoxy in order to reflect light emitted from the transmitter back to the optical receiver and to protect the optoelectronic device from mechanical damage. The method of using a light reflective opaque epoxy is disclosed in U.S. Pat. No. 4,645,554, issued to Adams et al. on Feb. 24, 1987, and which is hereby incorporated by reference.

Another way of forming the optoelectronic device is by replacing the light reflective epoxy with a thin reflective layer over the transparent epoxy and then an opaque epoxy encapsulating the reflective layer. This process was disclosed in U.S. Pat. No. 5,329,131, entitled "Opto-electronic Coupler Having Improved Moisture Protective Housing", issued to Wijdenes et al on Jul. 12, 1994, and which is hereby incorporated by reference.

The disadvantage of the above devices is that the light which is reflected from the emitter to the receiver is not consistent because of the geometry or shape of the transparent epoxy which is used to form the reflective material thereon. The transparent epoxy is dispensed on the surface of the optical emitter and optical receiver and allowed to take its natural shape. Thus, the reflective material formed thereover does not have an optimum or consistent shape.

It would be desirable to form the transparent epoxy so that the reflective layer thereover is formed in a consistent and repeatable fashion to optimize the reflection of the light emitted from the optical emitter and to the optical receiver. Optimized and consistent transmission of light results in optimized and consistent electrical characteristics of the optoelectronic device.

DETAILED DESCRIPTION OF THE DRAWINGS

Figure 1:
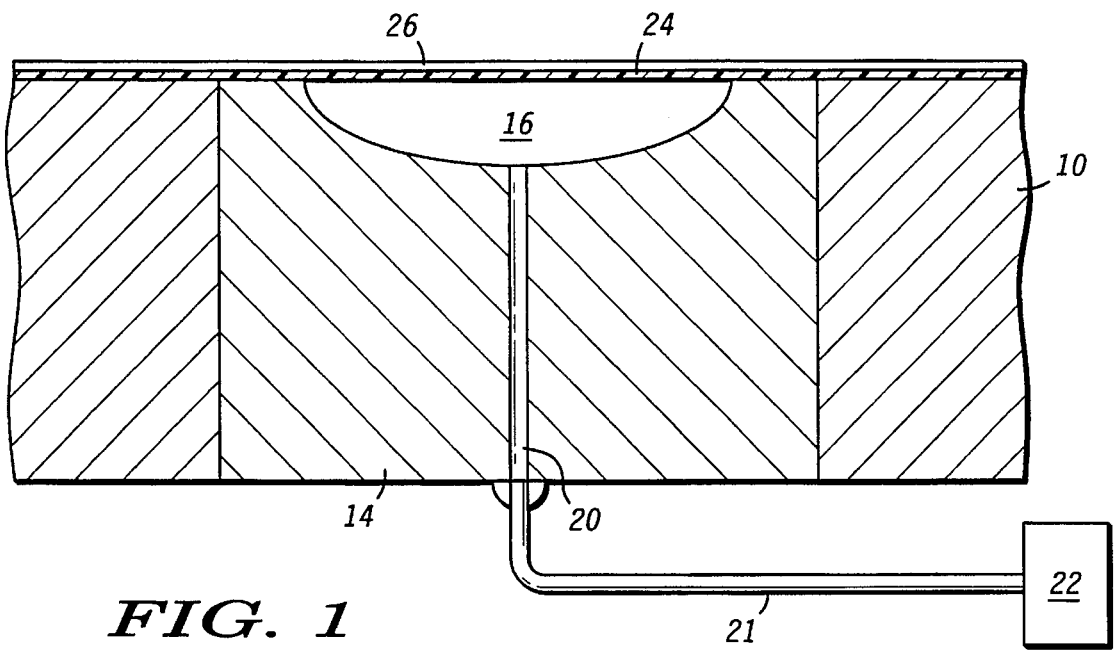
FIGS. 1–5 illustrate a cross-sectional view of the formation of an optoelectronic device in various stages of processing according to a first embodiment of the present invention.

FIG. 1 illustrates a cross-sectional view of a method of forming a polymeric body over an electronic device. In one embodiment, the polymeric body is used to form the shape of a reflective layer or mirror which functions to reflect light emitted from one electronic component to another electronic component.

The formation of this embodiment, and variations of this embodiment will be described below with reference to FIGS. 1–8. First, a base 10 is provided; base 10 is comprised of an insert 14 having a cavity 16 disposed therein. Base 10 is preferably comprised of metal for strength and durability. Insert 14 is also preferably comprised of metal. In addition, base 10 and insert 14 may be comprised of teflon or silicone in order to provide a surface which does not adhere to a polymer. Typically, base 10 is comprised of a plurality of inserts 14 and a plurality of cavities 16, of which only one is shown here for illustrative convenience. The shape of cavity 16 will be further described in subsequent FIGS. Base 10 can also be comprised of a single unit having a plurality of cavities 16 formed therein. The benefit of having insert 14 is that new inserts 14 can be made with cavities 16 of a different size and/or geometry or one insert 14 which is damaged or worn can be easily replaced without having to replace all of base 10.

In a preferred embodiment, a vacuum hole 20 is coupled to cavity 16 and the bottom of insert 14. A means for supplying a vacuum is provided by, for example, a vacuum hose 21 coupled to vacuum hole 20 and to a vacuum pump 22. Other ways to hold release film 24 (described below) adjacent to base 10 and insert 14 may be used.

A release film 24 is provided over base 10 and insert 14. Release film 24 is preferably comprised of a plastic film. In addition, a reflective layer 26 is preferably disposed on release film 24. Reflective layer 26 is comprised of any non-conducting or conducting reflective material, such as titanium dioxide or silver, reflective layer 26 may be formed over the entire surface of release film 24 or, alternatively, may be formed only over cavity 16. This embodiment is shown in, and further described with reference to FIG. 6.

Figure 2:
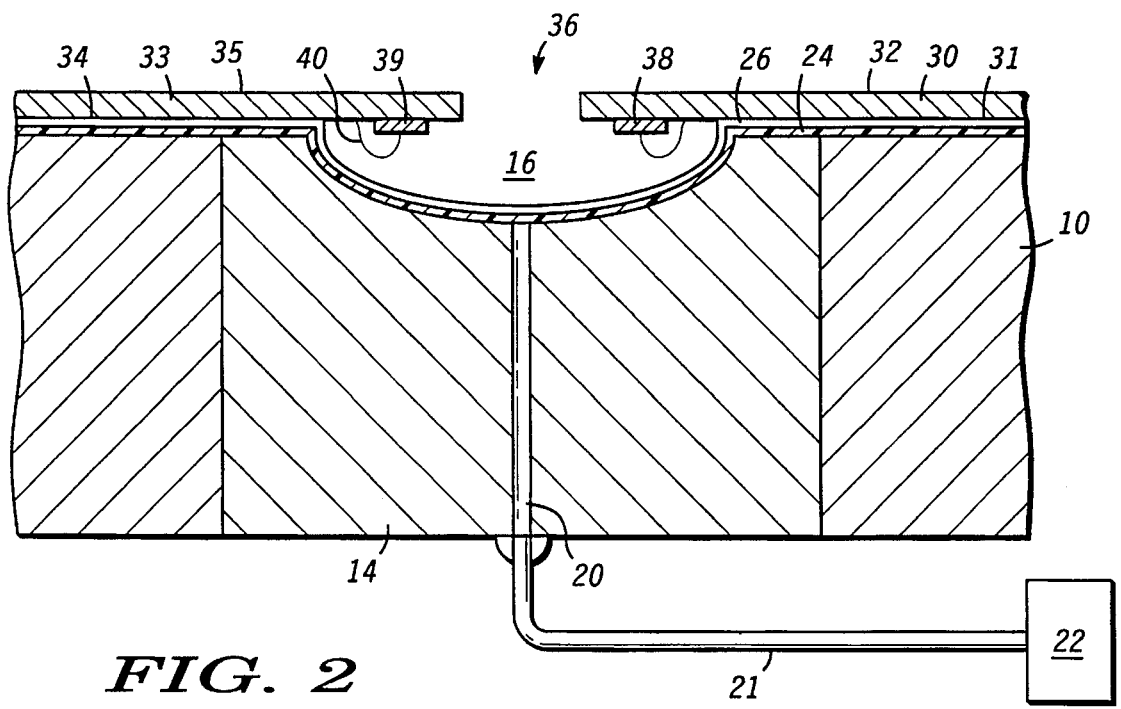

FIG. 2 illustrates the structure of FIG. 1 further along in processing. A vacuum is drawn through vacuum hole 20 in order to pull release film 24 adjacent to cavity 16. A substrate 30 having a top surface 31 and a bottom surface 32 and an optical emitter 38 electrically coupled to top surface 31 is provided so that top surface 31 is adjacent reflective layer 26 and optical emitter 38 overlies cavity 16. Similarly, a substrate 33 having a top surface 34 and a bottom surface 35 and an optical receiver 39 electrically coupled to top surface 34 is provided so that top surface 34 is adjacent reflective layer 26 and optical receiver 39 is over cavity 16. In this embodiment, optical emitter 38 and optical receiver 39 are electrically coupled to substrates 30 and 33, respectively through a wire bond 40. Wire bonding is well known in the art. Other suitable means of electrical coupling may be used. In this embodiment, substrates 30 and 33 are comprised of an electrode or leadframe. The method of coupling optical emitter 38 to substrate 30 and optical receiver 39 to substrate 33 is well known in the art. Typically, optical emitter 38 and optical receiver 39 are also wire bonded to the substrate, but is not shown here for illustrative convenience. An opening 36 is provided to cavity 16.

FIG. 2 illustrates an optoelectronic device used presently, which is known in the art as a discrete optocoupler. Optical emitter is typically a light emitting diode (LED), while optical receiver 39 is typically a light sensing diode or transistor. Modifications may be made to the optoelectronic device which do not affect the present invention disclosed herein. For example, it is possible that substrate 30 and 33 may be comprised of a single substrate, or a printed circuit board rather than a leadframe. Further, optical emitter 38 and optical receiver 39 may be formed on a single semiconductor chip but still be electrically isolated from one another.

Figure 3:
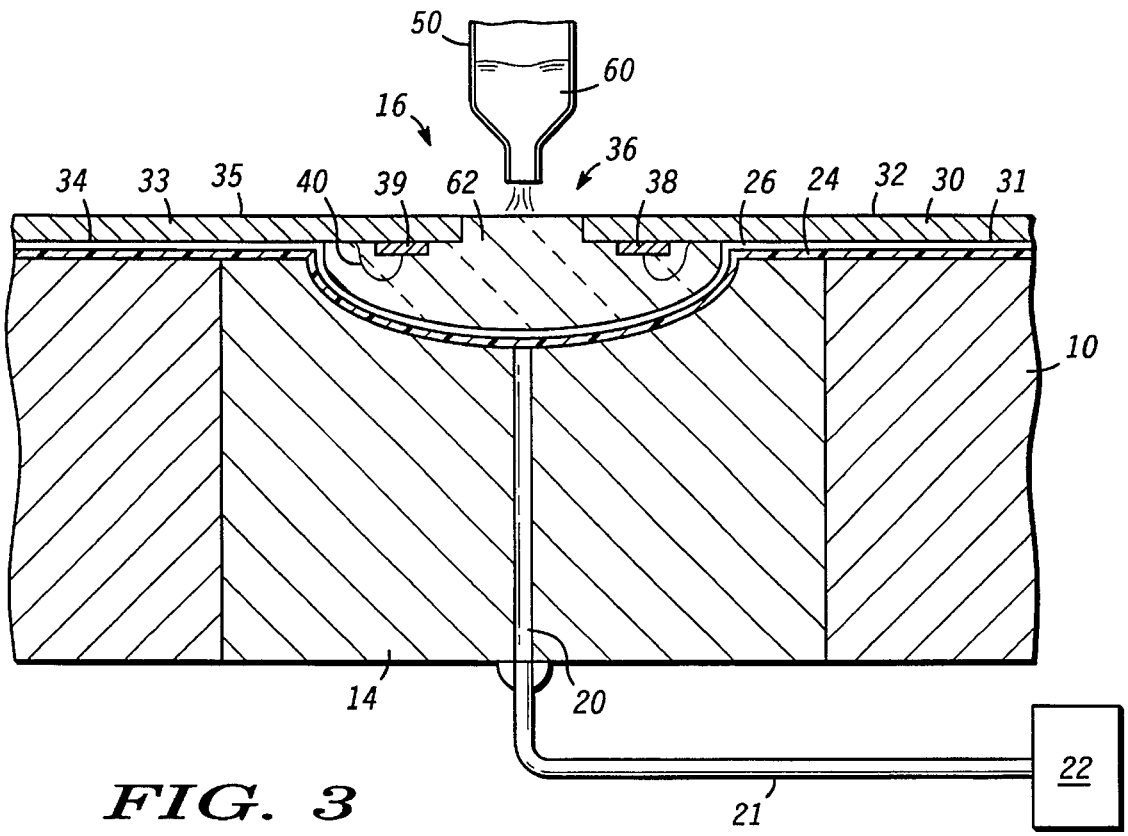

FIG. 3 illustrates subsequent processing of FIG. 2. A polymer 60 is dispensed into cavity 16 through opening 36 to at least fill all of cavity 16 up to bottom surface 32 and 35 of substrates 30 and 33. Polymer 60 is dispensed from any suitable dispenser 50, such as a syringe or other dispensing means. Polymer 60 also may be dispensed so that a portion of polymer body 62 overlies bottom surface 32 and 35 as shown in and further described with reference to FIG. 7. In this way, polymeric body 62 is cast in the mold or cavity 16 onto top surface 31 and 34 without use of pressure. Polymeric body 62 surrounds the electronic components, optical emitter 38 and optical receiver 39 and a portion of substrate 30 and 33. It is important to note that the casting of polymeric body 62 in cavity 16 preferably requires that air bubbles not be formed in polymeric body 62. An air bubble may cause reliability problems or issues. It is also important to note that transfer molding process is not the same as the casting process used herein. Transfer molding involves the use of pressure to fill a mold cavity. A transfer molded polymer 60 would result in severe decoupling of the wire bonds 40 from optical emitter 38 or optical receiver 39 or from substrate 30 or 33, because of the pressure used in transfer molding.

Polymeric body 62 must be transparent to the optical transmission, or optically transparent, from optical emitter 38, which may be in the visible or infrared spectrum and is comprised of any transparent polymer such as an epoxy, a silicone, or an acrylic that can be cast. In a preferred embodiment, polymer 60 is comprised of a cationically catalyzed epoxy resin. This type of epoxy resin has suitable rheological characteristics such as viscosity and thixotropic property which enables its use in the casting process. One such suitable polymer is available under the trade name PCX1400 manufactured by Polyset Corporation in New York, N.Y. In addition, it is preferable that polymer 60 have a coefficient of thermal expansion (CTE) which is compatible with the polymer comprising opaque polymeric body 80 (shown and described with reference to FIG. 8). This is important to prevent the addition of stresses to polymeric body 62 and optical emitter 38 and optical receiver 39, which can result in decoupling of optical emitter 38 or optical receiver 39 from substrate 30 or 33, respectively. Such decoupling would result in failure of the optoelectronic device.

The shape of polymeric body 62 can thus be optimized and formed in a consistent and repeatable fashion that had not been attainable in the prior art of merely dispensing an epoxy on the surface of an optocoupler device and allowing the epoxy to take its natural shape.

Figure 4:
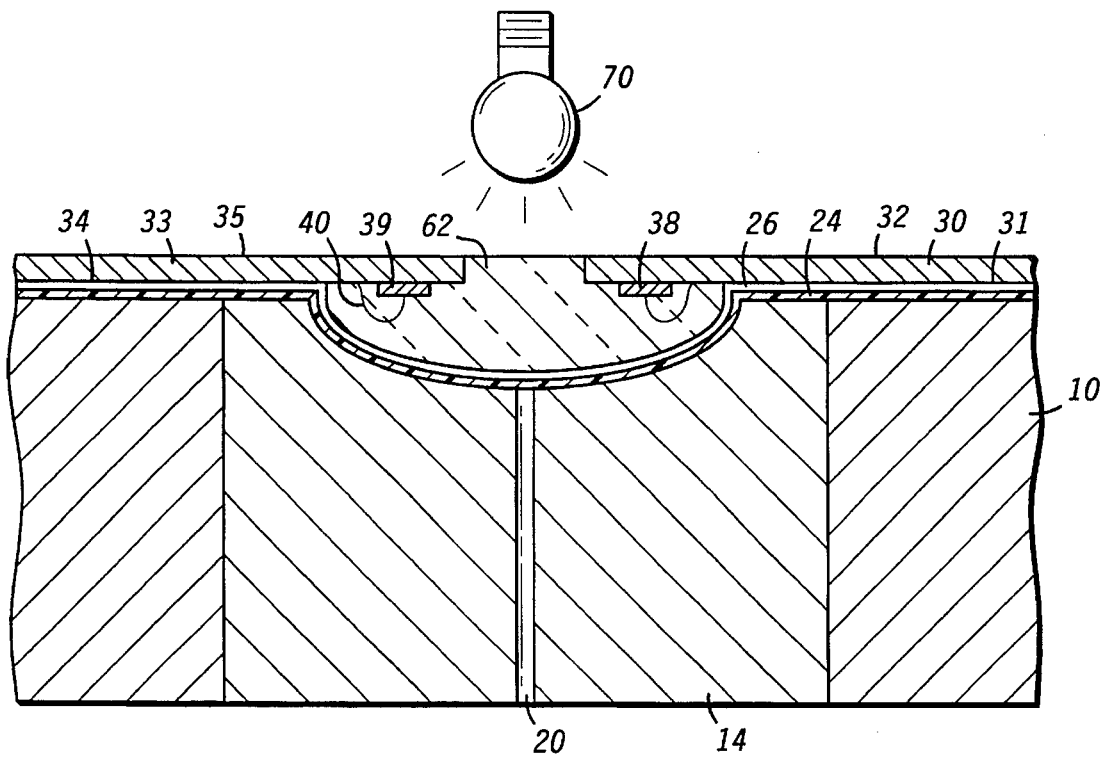

FIG. 4 illustrates subsequent processing in one embodiment of the present invention. Polymeric body 62 is cured by either thermal or ultra violet (UV) radiation. UV curing is shown in this embodiment. If polymer 60 is comprised of PCX1400 available from Polyset Corporation, UV curing takes place at a wavelength of 286 nanometers for approximately 30 seconds. The amount of cure necessary is dependent upon the characteristics of the polymer 60 used. One advantage of the present invention is that polymeric body 62 can be cured by UV radiation instead of by exposure to a high temperature (thermal curing). UV curing results in shortened cycle time because curing can take place in much less time than is required by thermal curing. Further, if polymeric body 62 is comprised of PCX1400, it has the flexibility of being either UV or thermally cured. Curing thermally is preferably performed at a temperature in the range of 120°–175° C. for less than 10 minutes. In the past, only a thermal cure polymer was used which required curing for as long as 3 hours at a temperature of 150° C. Release film 24 must be able to withstand the UV or thermal curing of polymeric body 62.

Figure 5:
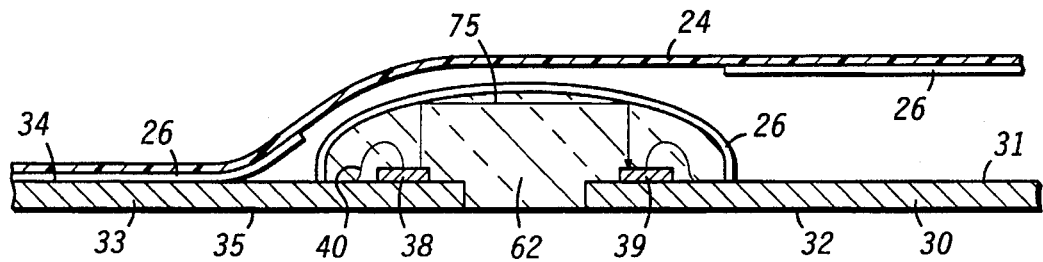

FIG. 5 illustrates the processing of transparent polymeric body 62 further along in processing. Substrates 30 and 33 are pulled away from base 10 and insert 14 and thereafter release film 24 is pulled away from substrates 30 and 33. Reflective layer 26 adheres to polymeric body 62 and remains on the surface of polymeric body 62 when release film 24 is pulled away. Reflective layer 26 is preferably of a thickness which prevents optical transmission therethrough. In this way, reflective layer 26 forms a mirror over polymeric body 62. In a preferred embodiment, the shape of polymeric body 62 is in the form of a concave mirror which can be optimized to transfer an optical transmission or light 75 from optical emitter 38 to optical receiver 39.

The use of a release film 24 is preferable so that no contamination or residue is left remaining on substrates 30 and 33 or reflective layer 26 or base 10 and insert 14. It is possible to use a release agent instead of a release film to prevent the adherence of polymeric body 62 to base 10 and insert 14. However, any release agent used must then be removed from the optoelectronic device before further encapsulation. In addition, if base 10 and insert 14 is comprised of teflon or silicone, then it is possible that a release film 24 is not necessary to prevent the adherence of polymeric body 62 on insert 14. However, it is believed that a residue of polymeric body 62 will be left remaining on a teflon surface, thus requiring cleaning of the teflon after the formation of polymeric body 62. Thus, a release film which is disposable is advantageously used to prevent contamination and dispense of the requirement for cleaning any surface. In addition, a release film 24 facilitates the formation of reflective layer 26 on polymeric body 62.

If release film 24 is not used, reflective layer 26 can be formed by other means, such as by coating a polymer comprised of a reflective material directly on polymeric body 62 after its formation. However, this method would involve additional steps, which adds cost to the manufacturing process. However, coating of reflective layer 26 on polymeric body 62 would still form a mirror having the optimum and consistent shape imparted by polymeric body 62 to reflect light 75 from optical emitter 38 to optical receiver 39.

Figure 6:
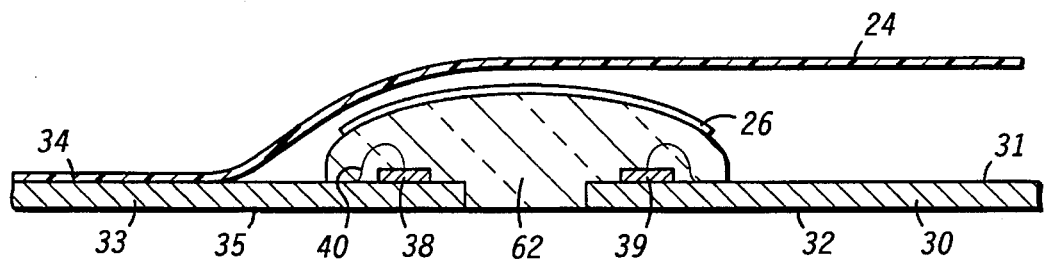
FIG. 6 illustrates a cross-sectional view of the formation of an optoelectronic device in accordance with a second embodiment of the present invention.

FIG. 6 illustrates a second embodiment of the present invention. In this embodiment, release film 24 is provided with a dot of a reflective layer 26 so that when release film 24 is removed, the dot of reflective layer 26 remains on polymeric body 62. In this embodiment, reflective layer 26 does not completely cover polymeric body 62. This embodiment may be advantageously used when reflective layer 26 is comprised of an electrically conductive material where it would be important to prevent the electrical coupling of reflective layer 26 and substrate 30 and 33.

Figure 7:
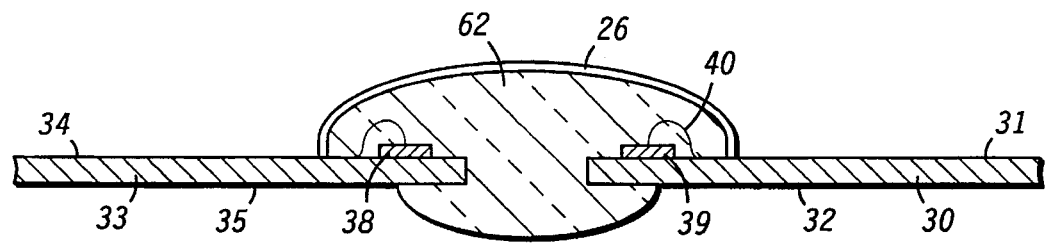
FIG. 7 illustrates a cross-sectional view of an optoelectronic device in accordance with a third embodiment of the present invention.

FIG. 7 illustrates the embodiment where polymer 60 is dispensed so that an amount of polymer 60 is disposed on bottom surface 32 and 35 of substrates 30 and 33. This embodiment is preferred in order to prevent arcing of voltage from substrate 30 to substrate 33 during operation.

Figure 8:
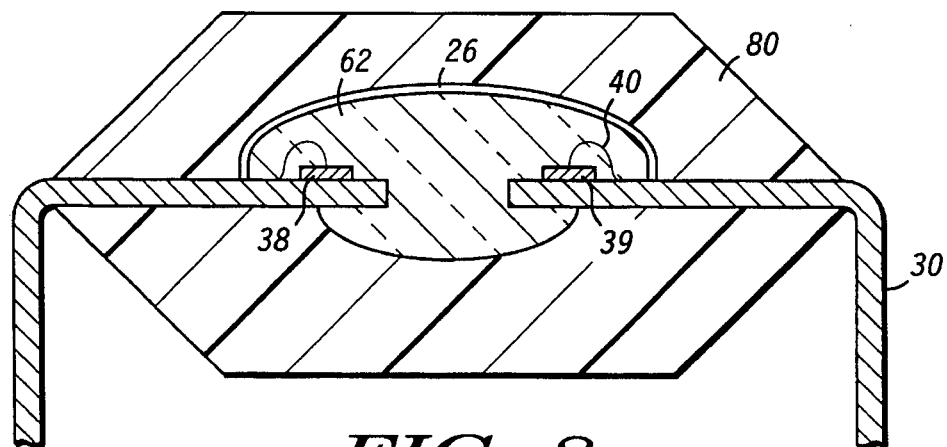
FIG. 8 illustrates a cross-sectional view of a completed optoelectronic device in accordance with the third embodiment of the present invention.

Any of the embodiments shown in FIGS. 5–7 may be further processed as illustrated in FIG. 8.

The further processing of structure of FIG. 7 is illustrated here in FIG. 8. An opaque polymeric body 80 is formed around portions of substrate 30 and 33 and over reflective layer 26 and polymeric body 62. Opaque polymeric body 80 is typically comprised of an opaque mold compound, such as an epoxy, which is commonly used in electronic component manufacturing. Opaque polymeric body 80 may also be comprised of a light reflective opaque epoxy. If a light reflective opaque epoxy is used, reflective layer 26 need not be formed over polymeric body 62. Opaque polymeric body 80 may be formed by any suitable method known in the art, for example, by transfer molding or by glob top. Opaque polymeric body 80 provides for mechanical strength and prevents moisture and air from entering to optical emitter 38 and optical receiver 39. Finally, substrates 30 and 33 are bent as shown to facilitate coupling with a printed circuit board or other member.

As can be seen, a method of forming a mirror having a consistent and defined shape allows for the optimization of coupling of optical transmission of an optoelectronic device. A transparent polymer is cast in a mold to provide the defined shape of the mirror. A release film is preferably used having a reflective layer disposed thereon which adheres to the polymer during its formation. The optoelectronic device of the present invention exhibits optimum and consistent electrical performance.

What is claimed is:

1. A method of forming a polymer on a substrate, comprising the steps of:
   providing a substrate having a top surface and a bottom surface and having an opening;
   providing at least one electronic component coupled to the top surface of the substrate;
   providing a base having a cavity formed therein;
   disposing a release film between the substrate and the base;
   disposing the substrate over the base wherein the top surface of the substrate is adjacent the base and the at least one electronic component is disposed over the cavity;
   dispensing through the opening in the substrate a polymer in the cavity of the base, wherein the polymer forms a polymeric body surrounding at least a portion of the substrate and the at least one electronic component; and
   curing the polymeric body.

2. The method of claim 1 further comprising holding the release film against the cavity before the step of dispensing the polymer.

3. The method of claim 2 wherein the step of holding comprises providing a hole in the base to the cavity and pulling a vacuum through the hole.

4. The method of claim 1 wherein the step of disposing the release film further comprises disposing a release film comprised of a reflective layer.

5. The method of claim 4 further comprising the step of forming an opaque polymeric body surrounding the reflective layer.

6. The method of claim 1 further comprising the step of forming an opaque polymeric body surrounding the polymeric body.

7. A method of forming a polymer on a leadframe comprising the steps of:
   providing a leadframe having a top surface and a bottom surface and having an opening formed therein;
   providing at least one electronic component coupled to the top surface of the leadframe;
   providing a base having a cavity formed therein;
   disposing a release film between the substrate and the base;
   disposing the leadframe over the base, wherein the top surface of the leadframe is adjacent the base and the at least one electronic component is disposed over the cavity; and
   casting through the opening the leadframe a polymer in the cavity of the base, wherein the polymer mates with at least a portion of the leadframe.

8. The method of claim 7 further comprising holding the release film against the cavity before the step of casting the polymer.

9. The method of claim 8 wherein the step of holding comprises providing a hole in the base to the cavity and pulling a vacuum through the hole.

10. The method of claim 7 wherein the step of disposing the release film further comprises disposing a release film comprised of a reflective layer.

11. A method of forming an optoelectronic device, comprising the steps of:
    providing a substrate having a front surface and a bottom surface and an opening formed therein;
    providing a first and a second optoelectronic device electrically coupled to the front surface of the substrate;
    providing a base having a cavity formed therein;
    disposing the front surface of the substrate over the base, wherein the first and the second optoelectronic device are disposed over the cavity;
    dispensing a polymer in the cavity through the opening in the substrate;
    allowing the polymer to take a shape without application of a pressure to form a polymeric body;
    pulling the substrate away from the base, wherein the polymeric body mates with at least a portion of the substrate; and
    forming a reflective layer over at least a portion of the polymeric body to reflect an optical transmission from the first optoelectronic device to the second optoelectronic device.

12. The method of claim 11 further comprising the step of disposing a release film between the substrate and the base.

13. The method of claim 11 wherein the step of dispensing the polymer comprises dispensing a polymer which is transparent to the optical transmission of the first optoelectronic device.

14. The method of claim 11 wherein the step of forming a reflective layer comprises forming a reflective layer comprised of titanium dioxide.

* * * * *